(12) United States Patent
Rezayee et al.

(10) Patent No.: US 9,692,417 B1
(45) Date of Patent: Jun. 27, 2017

(54) TRANSITION GLITCH SUPPRESSION CIRCUIT

(71) Applicant: Square, Inc., San Francisco, CA (US)

(72) Inventors: Afshin Rezayee, Richmond Hill (CA); Ravi Shivnaraine, Brampton (CA); Alain Rousson, Toronto (CA); Yue Yang, Thornhill (CA); Kajornsak Julavittayanukool, Toronto (CA)

(73) Assignee: Square, Inc., San Francisco, CA (US)

( * ) Notice: Subject to any disclaimer, the term of this patent is extended or adjusted under 35 U.S.C. 154(b) by 0 days.

(21) Appl. No.: 15/253,779

(22) Filed: Aug. 31, 2016

(51) Int. Cl.
*H03K 19/003* (2006.01)
*H03K 5/156* (2006.01)
*H03K 19/20* (2006.01)
*H03K 19/173* (2006.01)
*H03K 5/00* (2006.01)

(52) U.S. Cl.
CPC ......... *H03K 19/003* (2013.01); *H03K 5/1565* (2013.01); *H03K 19/1737* (2013.01); *H03K 19/20* (2013.01); *H03K 2005/00013* (2013.01)

(58) Field of Classification Search
None
See application file for complete search history.

(56) References Cited

U.S. PATENT DOCUMENTS

| 7,839,181 | B1 * | 11/2010 | Alfke | H03K 5/1252 327/34 |
| 2006/0082391 | A1 * | 4/2006 | Hsu | H03K 5/1252 327/34 |
| 2016/0005345 | A1 * | 1/2016 | Kubo | H03K 5/1252 345/214 |

* cited by examiner

*Primary Examiner* — Anh Tran
(74) *Attorney, Agent, or Firm* — Maynard Cooper & Gale LLP; Joshua V. Van Hoven, Esq.

(57) ABSTRACT

A transition glitch suppression circuit can be used to remove unwanted glitches occurring within a time delay of the rising edge or falling edge of a signal. The transition glitch suppression circuit has a delay element that can delay the input signal by the time delay to generate a delayed input signal. The transition glitch suppression circuit also has first and second logic circuits that process the input signal and the delayed input signal to generate corresponding outputs. A multiplexer provides the output signal for the suppression circuit by selecting between the output of the first logic circuit and the output of the second logic circuit based on the value of the output signal.

25 Claims, 7 Drawing Sheets

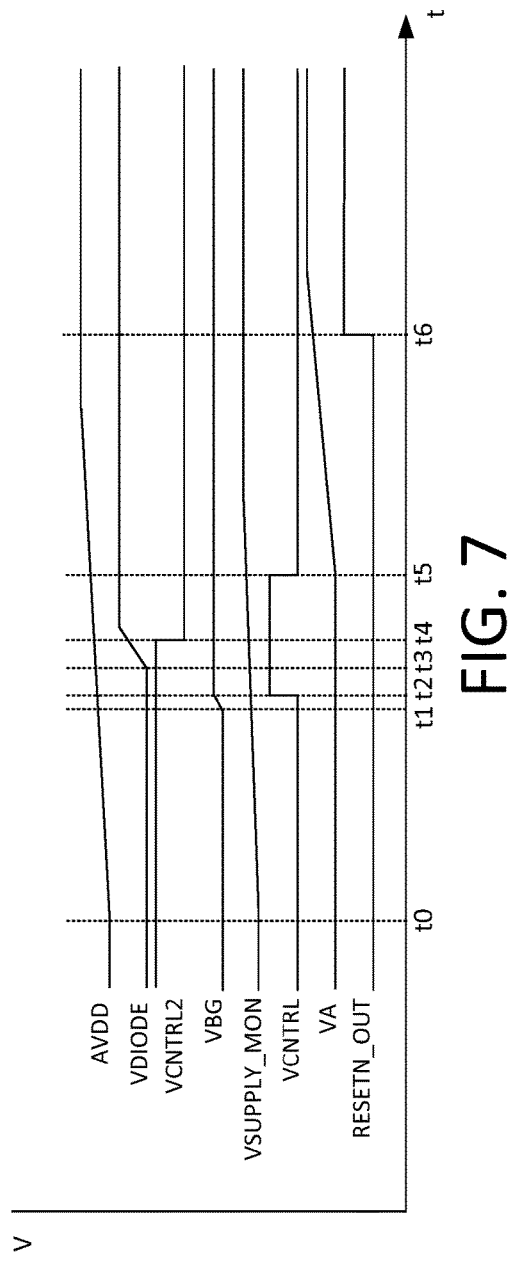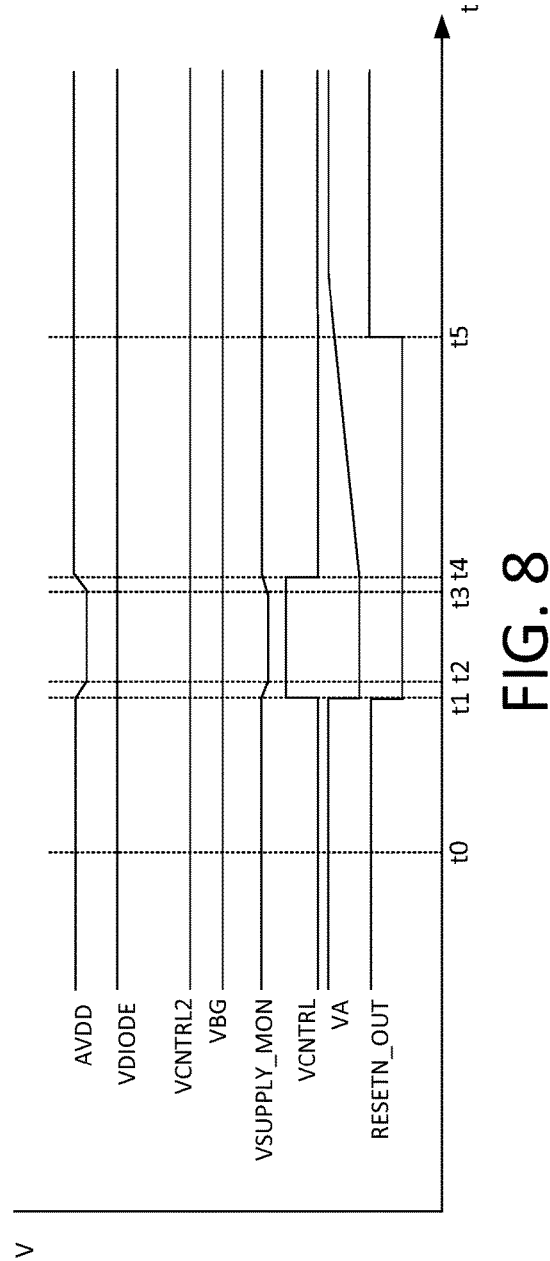

TRANSITION GLITCH SUPPRESSION CIRCUIT

BACKGROUND

Many elements of a chip (or integrated circuit) require a periodic signal such as a clock signal to ensure proper operation and timing of the elements of the chip. The clock signal can be a periodic signal having a duty cycle such as a 50% duty cycle (i.e., the signal is in a logical 1 state for the same amount of time that it is in the logical 0 state). In some instances, a clock signal may experience unexpected glitches during transitions from high to low or from low to high (i.e., transitions between a logical 1 and a logical 0 that are not intended as part of the period or duty cycle of the clock signal). These glitches may be of a short duration at the rising and falling edges of the clock signal. In some cases, unexpected glitches may disrupt the operation of the elements of the chip and can result in timing issues that can lead to further disruptions in the operation of the elements of the chip.

A payment terminal can include one or more chips with components requiring clock signals that are used to process payment transactions and interact with payment devices such as a payment card having a magnetic strip that is swiped in a magnetic reader of the payment terminal, a payment device having a Europay/Mastercard/Visa (EMV) chip that is inserted into a corresponding EMV slot of the payment terminal, and near field communication (NFC) enabled devices such as a smartphone or EMV card that is tapped at the payment terminal and transmits payment information over a secure wireless connection. In order to ensure accurate processing of payment transactions, stable operation of the chips in the payment terminal is required. Merchants and consumers attempting to complete a payment transaction may become frustrated if errors occur during payment transactions or the payment transactions are not otherwise processed accurately due to unstable operation of the chips in the payment terminal.

BRIEF DESCRIPTION OF THE DRAWINGS

The above and other features of the present disclosure, its nature and various advantages will be more apparent upon consideration of the following detailed description, taken in conjunction with the accompanying drawings in which:

FIGS. 7 and 8 depict illustrative timing diagrams for the supply voltage monitoring circuit of FIG. 6 in accordance with some embodiments of the present disclosure.

DETAILED DESCRIPTION

Figure 1:
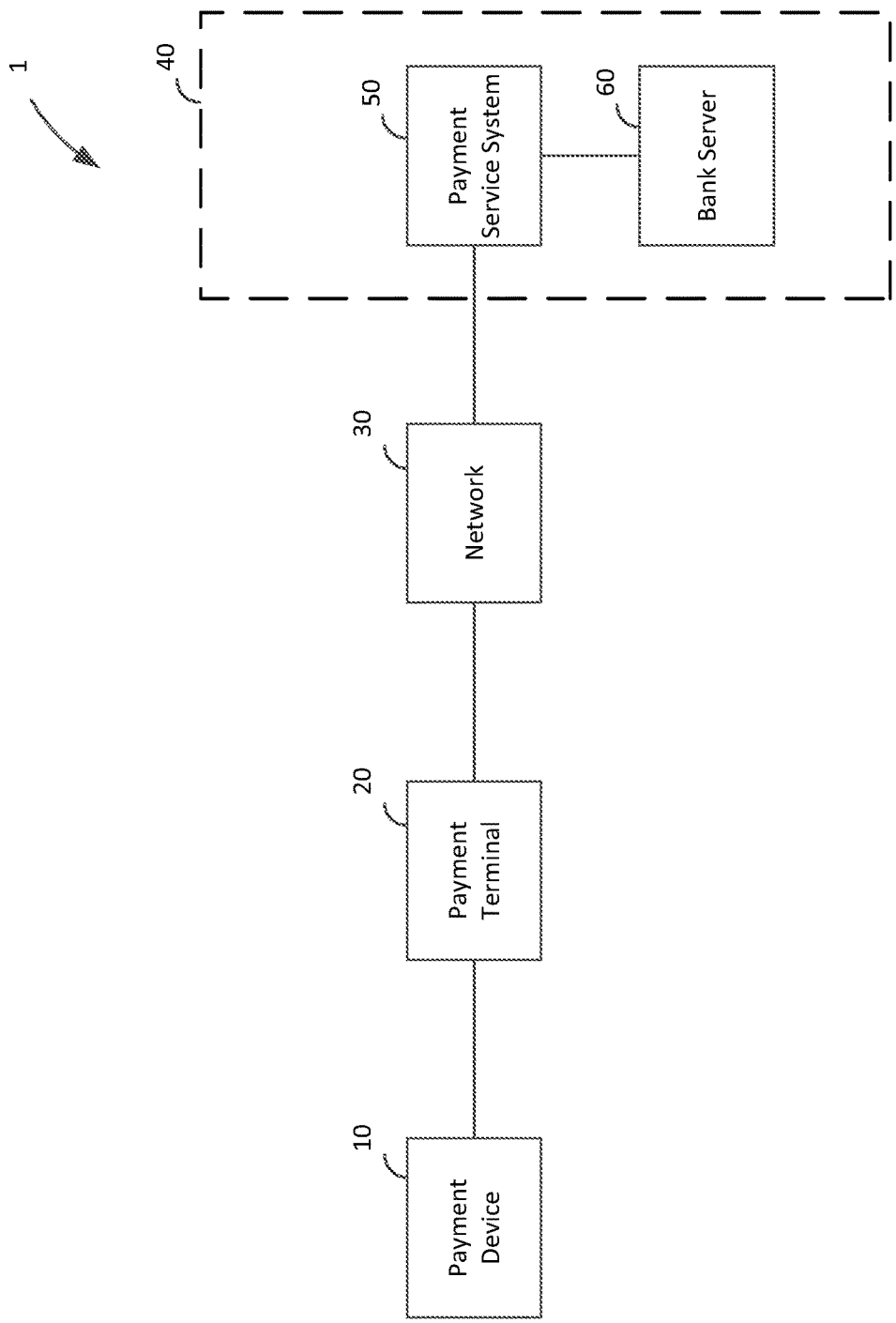
FIG. 1 shows an illustrative block diagram of a payment system in accordance with some embodiments of the present disclosure.

A chip of a payment terminal can include a clock that has a transition filter to remove unwanted transitions (e.g., glitches) that occur near the rising edges (i.e., transitions from logical 0 to logical 1) and falling edges (i.e., transitions from logical 1 to logical 0) of the clock signal. The transition filter can receive an input clock signal from a clock source and provide an output clock signal for use by other components of the reader chip. The output clock signal does not include any unwanted glitches between logical 1 and logical 0 (or vice versa), even if such glitches are present on the input signal.

The transition filter has a delay element that is used to delay the input signal by a time delay. The input signal and the delayed input signal are then provided as inputs to first and second logic circuits. The first logic circuit includes a NAND gate coupled in series with a NOR gate and the second logic circuit includes a NOR gate coupled in series with a NAND gate. The outputs of the first logic circuit (i.e., the output of the corresponding NOR gate) and the second logic circuit (i.e., the output of the corresponding NAND gate) are provided as inputs to a multiplexer. The multiplexer then selects either the output of the first logic circuit or the output of the second logic circuit to be the output of the multiplexer and the corresponding output signal from the transition filter. The selection of the output of the first logic circuit or the output of the second logic circuit by the multiplexer is based on the value of the output signal. The multiplexer can select the output of the first logic circuit if the output signal is a logical 0 and the multiplexer can select the output of the second logic circuit of the output signal is a logical 1.

The first logic circuit can be used to remove unwanted transitions near the rising edge of the clock signal and the second logic circuit can be used to remove unwanted transitions near the falling edge of the clock signal. The NAND gate of the first logic circuit can remove unwanted transitions near the rising edge of the clock signal by maintaining the output of the first logic circuit to be a logical 0 until the expiration of the time delay during which glitches are likely to occur. The first logic circuit maintains its output to be logical 0 until the expiration of the time delay by delaying a change in the output of the NAND gate. The change in the NAND gate is delayed as a result of the delayed input signal provided to the NAND gate still being a logical 0 until the expiration of the time delay, which logical 0 input keeps the output of the NAND gate a logical 1 (regardless of any unwanted glitch occurring in the input signal) and the output of the first logic circuit a logical 0.

Similarly, the NOR gate of the second logic circuit can remove unwanted transitions near the falling edge of the clock signal by maintaining the output of the second logic circuit to be a logical 1 until the expiration of the time delay. The second logic circuit maintains its output to be logical 1 until the expiration of the time delay by delaying a change in the output of the NOR gate. The change in the NOR gate is delayed as a result of the delayed input signal provided to the NOR gate still being a logical 1 until the expiration of the time delay, which logical 1 input keeps the output of the NOR gate a logical 0 (regardless of any unwanted transition occurring in the input signal) and the output of the second logic circuit a logical 1.

FIG. 1 depicts an illustrative block diagram of a payment system 1 in accordance with some embodiments of the present disclosure. In one embodiment, payment system 1 includes a payment device 10, payment terminal 20, network 30, and payment server 40. In an exemplary embodiment, payment server 40 may include a plurality of servers operated by different entities, such as a payment service system 50 and a bank server 60. These components of payment system 1 facilitate electronic payment transactions between a merchant and a customer.

The electronic interactions between the merchant and the customer take place between the customer's payment device 10 and the merchant's payment terminal 20. The customer has a payment device 10 such as a credit card having magnetic stripe, a credit card having an EMV chip, or a NFC-enabled electronic device such as a smart phone running a payment application. The merchant has a payment terminal 20 such as a payment terminal or other electronic device that is capable of processing payment information (e.g., encrypted payment card data and user authentication data) and transaction information (e.g., purchase amount and point-of-purchase information), such as a smart phone or tablet running a payment application.

In some embodiments (e.g., for low-value transactions or for payment transactions that are less than a payment limit indicated by a NFC or EMV payment device 10) the initial processing and approval of the payment transaction may be processed at payment terminal 20. In other embodiments, payment terminal 20 may communicate with payment server 40 over network 30. Although payment server 40 may be operated by a single entity, in one embodiment payment server 40 may include any suitable number of servers operated by any suitable entities, such as a payment service system 50 and one or more banks of the merchant and customer (e.g., a bank server 60). The payment terminal 20 and the payment server 40 communicate payment and transaction information to determine whether the transaction is authorized. For example, payment terminal 20 may provide encrypted payment data, user authentication data, purchase amount information, and point-of-purchase information to payment server 40 over network 30. Payment server 40 may determine whether the transaction is authorized based on this received information as well as information relating to customer or merchant accounts, and responds to payment terminal 20 over network 30 to indicate whether or not the payment transaction is authorized. Payment server 40 may also transmit additional information such as transaction identifiers to payment terminal 20.

Based on the information that is received at payment terminal 20 from payment server 40, the merchant may indicate to the customer whether the transaction has been approved. In some embodiments such as a chip card payment device, approval may be indicated at the payment terminal, for example, at a screen of a payment terminal. In other embodiments such as a smart phone or watch operating as a NFC payment device, information about the approved transaction and additional information (e.g., receipts, special offers, coupons, or loyalty program information) may be provided to the NFC payment device for display at a screen of the smart phone or watch or storage in memory.

Figure 2:
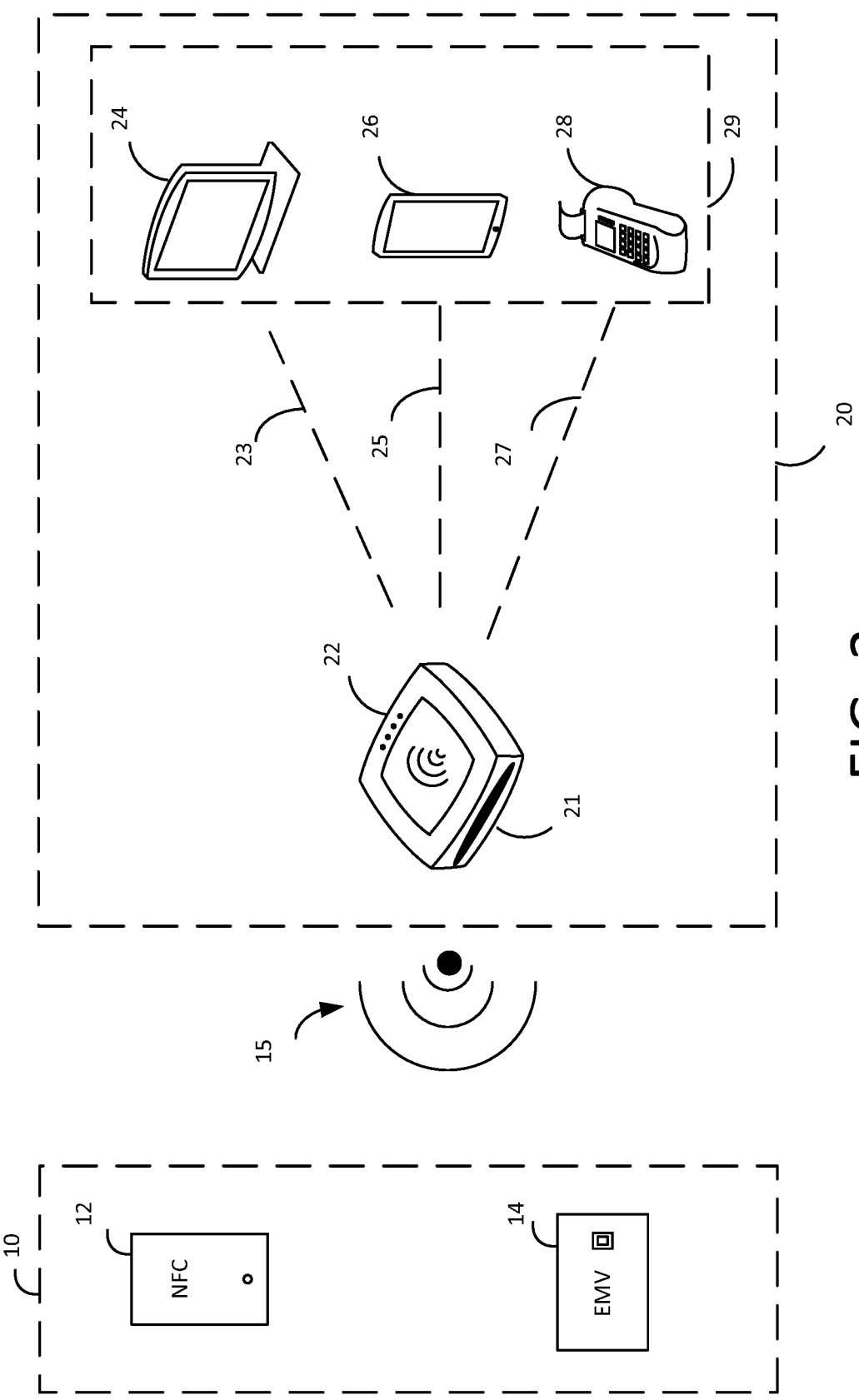
FIG. 2 depicts an illustrative block diagram of a payment device and payment terminal in accordance with some embodiments of the present disclosure.

FIG. 2 depicts an illustrative block diagram of payment device 10 and payment terminal 20 in accordance with some embodiments of the present disclosure. Although it will be understood that payment device 10 and payment terminal 20 of payment system 1 may be implemented in any suitable manner, in one embodiment the payment terminal 20 may comprise a payment reader 22 and a merchant device 29. However, it will be understood that as used herein, the term payment terminal may refer to any suitable component of the payment terminal, such as payment reader 22. In an embodiment, the payment reader 22 of payment terminal 20 may be a wireless communication device that facilitates transactions between the payment device 10 and a merchant device 29 running a point-of-sale application.

In one embodiment, payment device 10 may be a device that is capable of communicating with payment terminal 20 (e.g., via payment reader 22), such as a NFC device 12 or an EMV chip card 14. Chip card 14 may include a secure integrated circuit that is capable of communicating with a payment terminal such as payment terminal 20, generating encrypted payment information, and providing the encrypted payment information as well as other payment or transaction information (e.g., transaction limits for payments that are processed locally) in accordance with one or more electronic payment standards such as those promulgated by EMVCo. Chip card 14 may include contact pins for communicating with payment reader 22 (e.g., in accordance with ISO 7816) and in some embodiments, may be inductively coupled to payment reader 22 via a near field 15. A chip card 14 that is inductively coupled to payment reader 22 may communicate with payment reader 22 using load modulation of a wireless carrier signal that is provided by payment reader 22 in accordance with a wireless communication standard such as ISO 14443.

NFC device 12 may be an electronic device such as a smart phone, tablet, or smart watch that is capable of engaging in secure transactions with payment terminal 20 (e.g., via communications with payment reader 22). NFC device 12 may have hardware (e.g., a secure element including hardware and executable code) and/or software (e.g., executable code operating on a processor in accordance with a host card emulation routine) for performing secure transaction functions. During a payment transaction, NFC device 12 may be inductively coupled to payment reader 22 via near field 15 and may communicate with payment terminal 20 by active or passive load modulation of a wireless carrier signal provided by payment reader 22 in accordance with one or more wireless communication standards such as ISO 14443 and ISO 18092.

Although payment terminal 20 may be implemented in any suitable manner, in one embodiment payment terminal 20 may include a payment reader 22 and a merchant device 29. The merchant device 29 runs a point-of-sale application that provides a user interface for the merchant and facilitates communication with the payment reader 22 and the payment server 40. Payment reader 22 may facilitate communications between payment device 10 and merchant device 29. As described herein, a payment device 10 such as NFC device 12 or chip card 14 may communicate with payment reader 22 via inductive coupling. This is depicted in FIG. 2 as near field 15, which comprises a wireless carrier signal having a suitable frequency (e.g., 13.56 MHz) emitted from payment reader 22.

In one embodiment, payment device 10 may be a contactless payment device such as NFC device 12 or chip card 14, and payment reader 22 and the contactless payment device 10 may communicate by modulating the wireless carrier signal within near field 15. In order to communicate information to payment device 10, payment reader 22 changes the amplitude and/or phase of the wireless carrier signal based on data to be transmitted from payment reader 22, resulting in a wireless data signal that is transmitted to the payment device. This signal is transmitted by an antenna of payment reader 22 that is tuned to transmit at 13.56 MHz, and if the payment device 10 also has a suitably tuned antenna within the range of the near field 15 (e.g., 0 to 10 cm), the payment device receives the wireless carrier signal or wireless data signal that is transmitted by payment reader 22. In the case of a wireless data signal, processing circuitry of the payment device 10 is able to demodulate the received signal and process the data that is received from payment reader 22.

When a contactless payment device such as payment device 10 is within the range of the near field 15, it is inductively coupled to the payment reader 22. Thus, the payment device 10 is also capable of modulating the wireless carrier signal via active or passive load modulation. By changing the tuning characteristics of the antenna of payment device 10 (e.g. by selectively switching a parallel load into the antenna circuit based on modulated data to be transmitted) the wireless carrier signal is modified at both the payment device 10 and payment reader 22, resulting in a modulated wireless carrier signal. In this manner, the payment device is capable of sending modulated data to payment reader 22.

In some embodiments, payment reader 22 also includes an EMV slot 21 that is capable of receiving chip card 14. Chip card 14 may have contacts that engage with corresponding contacts of payment reader 22 when chip card 14 is inserted into EMV slot 21. Payment reader 22 provides power to an EMV chip of chip card 14 through these contacts and payment reader 22 and chip card 14 communicate through a communication path established by the contacts.

Payment reader 22 may also include hardware for interfacing with a magnetic strip card (not depicted in FIG. 2). In some embodiments, the hardware may include a slot that guides a customer to swipe or dip the magnetized strip of the magnetic strip card such that a magnetic strip reader can receive payment information from the magnetic strip card. The received payment information is then processed by the payment reader 22.

Merchant device 29 may be any suitable device such as tablet payment device 24, mobile payment device 26, or payment terminal 28. In the case of a computing device such as tablet payment device 24 or mobile payment device 26, a point-of-sale application may provide for the entry of purchase and payment information, interaction with a customer, and communications with a payment server 40. For example, a payment application may provide a menu of services that a merchant is able to select and a series of menus or screens for automating a transaction. A payment application may also facilitate the entry of customer authentication information such as signatures, PIN numbers, or biometric information. Similar functionality may also be provided on a dedicated payment terminal 28.

Merchant device 29 may be in communication with payment reader 22 via a communication path 23/25/27. Although communication path 23/25/27 may be implemented via a wired (e.g., Ethernet, USB, FireWire, Lightning) or wireless (e.g., Wi-Fi, Bluetooth, NFC, or ZigBee) connection, in one embodiment payment reader 22 may communicate with the merchant device 29 via a Bluetooth low energy interface, such that the payment reader 22 and the merchant device 29 are connected devices. In some embodiments, processing of the payment transaction may occur locally on payment reader 22 and merchant device 29, for example, when a transaction amount is small or there is no connectivity to the payment server 40. In other embodiments, merchant device 29 or payment reader 22 may communicate with payment server 40 via a public or dedicated communication network 30. Although communication network 30 may be any suitable communication network, in one embodiment communication network 30 may be the internet and payment and transaction information may be communicated between payment terminal 20 and payment server 40 in an encrypted format such by a transport layer security (TLS) or secure sockets layer (SSL) protocol.

Figure 3:
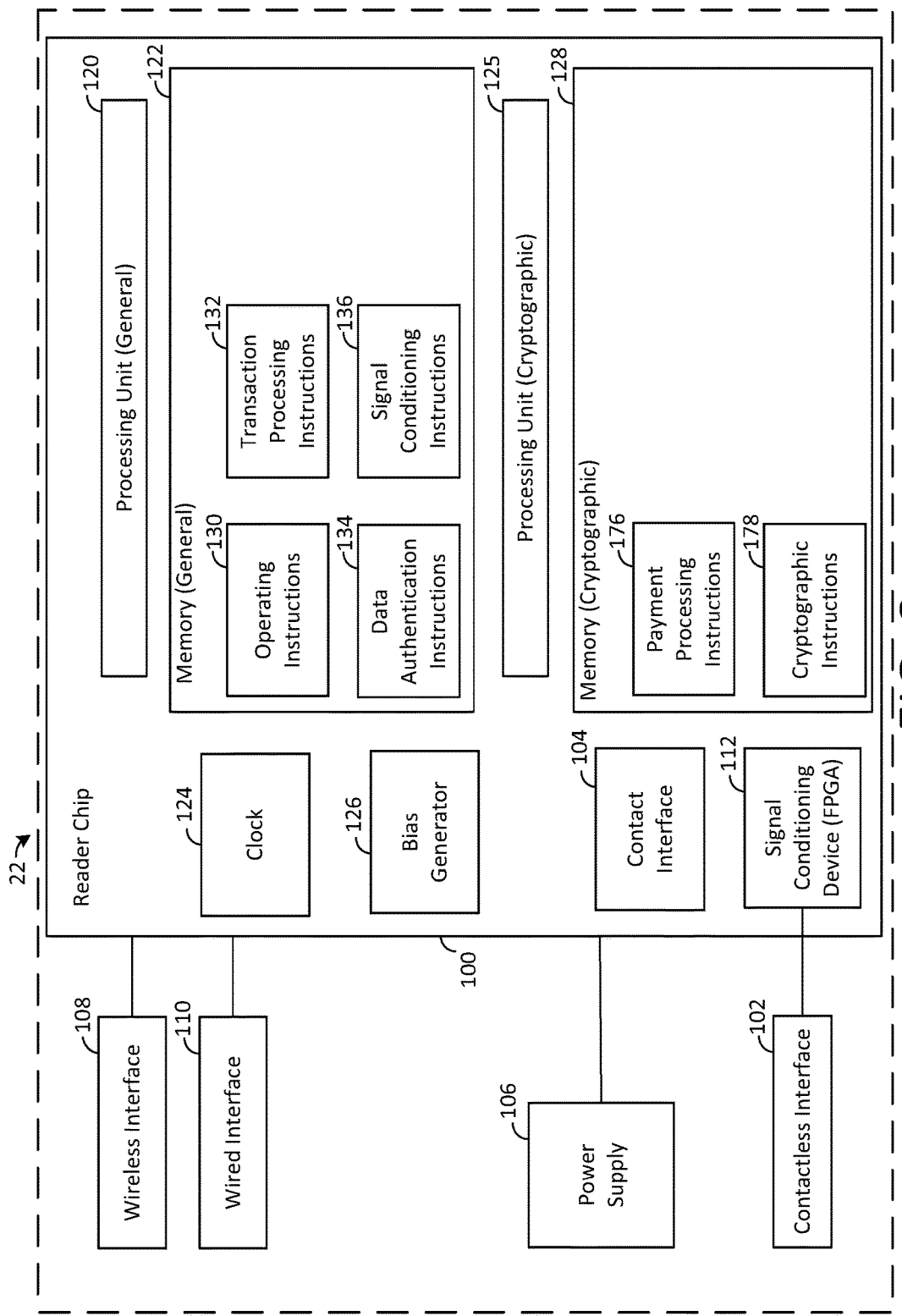
FIG. 3 depicts an illustrative block diagram of a payment reader in accordance with some embodiments of the present disclosure.

FIG. 3 depicts a block diagram of an exemplary payment reader 22 in accordance with some embodiments of the present disclosure. In one embodiment, payment reader 22 may be a wireless communication device that communicates wirelessly with an interactive electronic device such as a merchant device 29, for example, using Bluetooth classic or Bluetooth low energy. Although particular components are depicted in a particular arrangement in FIG. 3, it will be understood that payment reader 22 may include additional components, one or more of the components depicted in FIG. 3 may not be included in payment reader 22, and the components of payment reader 22 may be rearranged in any suitable manner. In one embodiment, payment reader 22 includes a terminal chip (e.g., in a payment terminal 20) utilizing a payment reader, a reader chip 100, a plurality of payment interfaces (e.g., a contactless interface 102 and a contact interface 104), a power supply 106, a wireless communication interface 108, a wired communication interface 110, and a signal conditioning device 112. Payment reader 22 may also include a general processing unit 120 (e.g., a terminal/reader processing unit), general memory 122, a cryptographic processing unit 125 and cryptographic memory 128. Although in one embodiment the processing units and memories will be described as packaged in a reader chip 100, and configured in a particular manner, it will be understood that general processing unit 120, general memory 122, a cryptographic processing unit 125 and cryptographic memory 128 may be configured in any suitable manner to perform the functionality of the payment reader 22 as is described herein. It will also be understood that the functionality of reader chip 100 may be embodied in a single chip or a plurality of chips, each including any suitable combination of processing units and memory to collectively perform the functionality of reader chip 100 described herein.

In some embodiments, reader chip 100 may be a suitable chip having a processing unit. Processing unit 120 of reader chip 100 of payment reader 22 may be a suitable processor and may include hardware, software, memory, and circuitry as is necessary to perform and control the functions of payment reader 22. Processing unit 120 may include one or more processors, and may perform the operations of reader chip 100 based on instructions in any suitable number of memories and memory types. In some embodiments, processing unit 120 may have multiple independent processing units, for example a multi-core processor or other similar component. Processing unit 120 may execute instructions stored in memory 122 of reader chip 100 to control the operations and processing of payment reader 22. As used herein, a processor or processing unit may include one or more processors having processing capability necessary to perform the processing functions described herein, including but not limited to hardware logic (e.g., hardware designed by software that that describes the configuration of hardware, such as hardware description language (HDL) software), computer readable instructions running on a processor, or any suitable combination thereof. A processor may run software to perform the operations described herein, including software accessed in machine readable form on a tangible non-transitory computer readable storage medium.

In an exemplary embodiment, the processing unit 120 of reader chip 100 may include two RISC processors configured to operate as a hub for controlling operations of the various components of payment reader 22, based on instructions stored in memory 122. As used herein, memory may refer to any suitable tangible or non-transitory storage medium. Examples of tangible (or non-transitory) storage medium include disks, thumb drives, and memory, etc., but does not include propagated signals. Tangible computer readable storage medium include volatile and non-volatile, removable and non-removable media, such as computer readable instructions, data structures, program modules or other data. Examples of such media include RAM, ROM, EPROM, EEPROM, SRAM, flash memory, disks or optical storage, magnetic storage, or any other non-transitory medium that stores information that is accessed by a processor or computing device.

Reader chip 100 may also include additional circuitry such as interface circuitry, analog front end circuitry, security circuitry, and monitoring component circuitry. In one embodiment, interface circuitry may include circuitry for interfacing with a wireless communication interface 108 (e.g., Wi-Fi, Bluetooth classic, and Bluetooth low energy), circuitry for interfacing with a wired communication interface 110 (e.g., USB, Ethernet, FireWire, and Lightning), circuitry for interfacing with other communication interfaces or buses (e.g., I²C, SPI, UART, and GPIO), and circuitry for interfacing with a power supply 106 (e.g., power management circuitry, power conversion circuitry, rectifiers, and battery charging circuitry).

In an exemplary embodiment, reader chip 100 may perform functionality relating to processing of payment transactions, interfacing with payment devices, cryptography, and other payment-specific functionality. In some embodiments, reader chip 100 may include a cryptographic processing unit 125 for handling cryptographic processing operations. Note that each of general processing unit 120 and cryptographic processing unit 125 may have dedicated memory associated therewith (i.e., general memory 122 and cryptographic memory 128). In this manner, specific cryptographic processing and critical security information (e.g., cryptographic keys, passwords, user information, etc.), may be securely stored by cryptographic memory 128 and processed by cryptographic processing unit 125.

One or both of general processing unit 120 and cryptographic processing unit 125 of reader chip 100 may communicate with the other (e.g., processing unit 120 may communicate with cryptographic processing unit 125 and vice versa), for example, using any suitable internal bus and communication technique. In this manner, reader chip 100 can process transactions and communicate information regarding processed transactions (e.g., with merchant device 29).

Reader chip 100 may also include circuitry for implementing a contact interface 104 (e.g., power and communication circuitry for directly interfacing with an EMV chip of a chip card 14 that is inserted into slot 21). In some embodiments, reader chip 100 also may also include analog front end circuitry for interfacing with the analog components of contactless interface 102 (e.g., electromagnetic compatibility (EMC) circuitry, matching circuits, modulation circuitry, and measurement circuitry).

Contactless interface 102 may provide for NFC communication with a contactless device such as NFC device 12 or chip card 14. Based on a signal provided by reader chip 100, an antenna of contactless interface 102 may output either a carrier signal or a modulated signal. A carrier signal may be a signal having a fixed frequency such as 13.56 MHZ. A modulated signal may be a modulated version of the carrier signal according to a modulation procedure such as ISO 14443 and ISO 18092. When the payment reader 22 is inductively coupled to a contactless device, the contactless device may also modulate the carrier signal, which may be sensed by the contactless interface 102 and provided to the reader chip 100 for processing. Based on these modulations of the carrier signal, payment reader 22 and a contactless device are able to communicate information such as payment information.

Contact interface 104 may be a suitable interface for providing power to a payment chip such as an EMV chip of a chip card 14 and communicating with the EMV chip. Contact interface 104 may include a plurality of contact pins (not depicted in FIG. 3) for physically interfacing with the chip card 14 according to EMV specifications. In some embodiments, contact interface 104 may include a power supply (VCC) pin, a ground (GND) pin, a reset (RST) pin for resetting an EMV card, a clock (CLK) pin for providing a clock signal, a programming voltage (VPP) pin for providing a programming voltage to an EMV card, an input output (I/O) pin for providing for EMV communications, and two auxiliary pins. In this manner, the payment reader and the chip card 14 are able to exchange information such as payment information. Note that, in some embodiments, contact interface 104 may be housed on reader chip 100 and may communicate with the various components of reader chip 100 via any suitable means (e.g., a common internal bus).

Power supply 106 may include one or more power supplies such as a physical connection to AC power, DC power, or a battery. Power supply 106 may include power conversion circuitry for converting an AC or DC power source into a plurality of DC voltages for use by components of payment reader 22. When power supply 106 includes a battery, the battery may be charged via a physical power connection, via inductive charging, or via any other suitable method. Although not depicted as physically connected to the other components of the payment reader 22 in FIG. 3, power supply 106 may supply a variety of voltages to the components of the payment reader 22 in accordance with the requirements of those components.

Wireless communication interface 108 may include suitable wireless communications hardware (e.g., antennas, matching circuitry, etc.) and one or more processors having processing capability necessary to engage in wireless communication (e.g., with a merchant device 29 via a protocol such as Bluetooth low energy) and control associated circuitry, including but not limited to hardware logic, computer readable instructions running on a processor, or any suitable combination thereof. Although wireless communication interface 108 may be implemented in any suitable manner, in an exemplary embodiment, wireless communication interface 108 may be implemented as a Texas Instruments CC2640 device, which may include a processing unit (not depicted) and memory (not depicted).

Wired communication interface 110 may include any suitable interface for wired communication with other devices or a communication network, such as USB, Lightning, FireWire, Ethernet, any other suitable wired communication interface, or any combination thereof. In some embodiments, wired communication interface 110 may allow payment reader to communicate with one or both of merchant device 29 and payment server 40.

In some embodiments, reader chip 100 may include a signal conditioning device 112. Although signal conditioning device 112 may include any suitable hardware, software, or any combination thereof, in an exemplary embodiment signal conditioning device may comprise an FPGA. Signal condition device 112 may receive and conditioning signals sent from contactless interface 102, such as when a payment device 10 using NFC communication communicates with payment reader 22. In an embodiment, signal conditioning device 112 may operate based on instructions stored at reader chip 100 (e.g., signal conditioning instructions 136) for use in interacting with the contactless interface 102.

In some embodiments, general memory 122 may be any suitable memory as described herein, and may include a plurality of sets of instructions for controlling operations of payment reader 22 and performing general transaction processing operations of payment reader 22, such as operating instructions 130, transaction processing instructions 132, data authentication instructions 134, and signal conditioning instructions 136.

Operating instructions 130 may include instructions for controlling general operations of the payment reader 22, such as internal communications, power management, processing of messages, system monitoring, sleep modes, user interface response and control, operation of the contact interface 104, the wireless interface 108, the wired interface 110, or the signal conditioning device 112, and the management of the other sets of instructions. In one embodiment, the operating instructions 130 may provide the operating system and applications necessary to perform most of the processing operations that are performed by the processing unit 120 of the reader chip 100 of payment reader 22.

Operating instructions 130 may also include instructions for interacting with a merchant device 29. In one embodiment, the merchant device 29 may be running a point-of-sale application. The operating instructions 130 may include instructions for a complementary application to run on processing unit 120 of reader chip 100, in order to exchange information with the point-of-sale application. For example, the point-of-sale application may provide a user interface that facilitates a user such as a merchant to engage in purchase transactions with a customer. Menus may provide for the selection of items, calculation of taxes, addition of tips, and other related functionality. When it is time to receive payment, the point-of-sale application may send a message to the payment reader 22 (e.g., via wireless interface 108). The operating instructions 130 facilitate processing of the payment, for example, by acquiring payment information via the contactless interface 102 or contact interface 104, and invoking the various resources of reader chip 100 to process that payment information (e.g., by executing memories stored in cryptographic memory 128 using cryptographic processing unit 125), and by generating responsive messages that are transmitted to the point-of-sale application of the merchant device 29 via wireless communication interface 108 and wired communication interface 110.

Operating instructions 130 may also include instructions for interacting with a payment service system 50 at a payment server 40. In one embodiment, a payment service system 50 may be associated with the payment reader 22 and the point-of-sale application of the merchant device 29. For example, the payment service system 50 may have information about payment readers 22 and merchant devices 29 that are registered with the payment service system 50 (e.g., based on unique identifiers). This information may be used to process transactions with servers of the merchant and customer financial institutions, for providing analysis and reports to a merchant, and aggregating transaction data. The payment reader 22 may process payment information (e.g., based on operation of reader chip 100) and communicate the processed payment information to the point-of-sale application, which in turn communicates with the payment service system 50. In this manner, messages from the payment reader 22 may be forwarded to the payment service system 50 of payment server 40, such that the payment reader 22 and payment service system 50 may collectively process the payment transaction.

Transaction processing instructions 132 may include instructions for controlling general transaction processing operations of the payment reader 22, such as controlling the interaction between the payment reader 22 and a payment device 10 (e.g., for interfacing with a payment device via the contactless interface 102 and contact interface 104), selecting payment processing procedures (e.g., based on a payment processing entity associated with a payment method), interfacing with the cryptographic processor 125, and any other suitable aspects of transaction processing.

Transaction processing instructions 132 also may include instructions for processing payment transactions at payment reader 22. In one embodiment, the transaction processing instructions may be compliant with a payment standard such as those promulgated by EMV. Depending on the payment method that is being used (e.g., Europay, Mastercard, Visa, American Express, etc.), a particular processing procedure associated with the payment method may be selected and the transaction may be processed according to that procedure. When executed by processing unit 120, these instructions may determine whether to process a transaction locally, how payment information is accessed from a payment device, how that payment information is processed, which cryptographic functions to perform, the types of communications to exchange with a payment server, and any other suitable information related to the processing of payment transactions. In some embodiments, transaction processing instructions 132 may perform high level processing, and provide instructions for processing unit 120 to communicate with cryptographic processing unit 125 to perform most transaction processing operations. In addition, transaction processing instructions 132 may provide instructions for acquiring any suitable information from a chip card (e.g., via contact interface 104 and cryptographic processing unit 125) such as authorization responses, card user name, card expiration, etc.

Data authentication instructions 134 may include instructions for providing configuration information for a payment terminal 20. The configuration information may include any suitable information, such as payment limits and types of transactions for local transactions (i.e., transactions that occur without contacting a payment server 40) and supported applications. As an example, in some embodiments, data authentication instructions 134 may include configuration instructions such as TMS-CAPK instructions. In some embodiments, the TMS-CAPK may be tailored for a particular jurisdiction (e.g., country-specific).

Signal conditioning instructions 136 may include instructions for conditioning signals received from a payment device 10 via the contactless interface 102 (e.g., from a NFC payment device 10). Although in some embodiments, signal conditioning instructions 136 may include instructions for manipulating signals received via contactless interface 102, signal conditioning instructions 136 may include instructions for conditioning signals, including signals that are initially processed by signal conditioning hardware, such as signal conditioning device 112.

Cryptographic processing unit 125 may be any suitable a processor as described herein, and, in some embodiments, may perform cryptographic functions for the processing of payment transactions. For example, in some embodiments a cryptographic processing unit 125 may encrypt and decrypt data based on one or more encryption keys, in a manner that isolates the encryption functionality from other components of payment reader 22 and protects the encryption keys from being exposed to other components of payment reader 22.

In some embodiments, cryptographic memory 128 may be any suitable memory or combination thereof as described herein, and may include a plurality of sets of instructions for performing cryptographic operations, such as payment processing instructions 176, and cryptographic instructions 178. Payment processing instructions 176 may include instructions for performing aspects of payment processing, such as providing for encryption techniques to be used in association with particular payment procedures, accessing account and processing information, any other suitable payment processing functionality, or any suitable combination thereof. Cryptographic instructions 178 may include instructions for performing cryptographic operations. Cryptographic processing unit 125 may execute the cryptographic instructions 178 to perform a variety of cryptographic functions, such as to encrypt, decrypt, sign, or verify a signature upon payment and transaction information as part of a payment transaction.

The reader chip 100 may also include a clock 124 and bias generator 126. Bias generator 126 may be connected to the power supply 106 and may generate one or more bias voltages that are provided to components of reader chip 100 such as contact interface 104, processing unit 120, and memory 122. In one embodiment, a suitable bias voltage generated by bias generator 126 may be 3.3 volts. Clock 124 may include a clock source (not depicted) and a clock management unit (not depicted). The clock source may be any suitable clock source such as a crystal oscillator and may provide a clock signal at a clock frequency to the clock management unit. The clock management unit may generate a plurality of clock signals (to be output by clock 124) based on the input from the clock source, for example, a clock signal for processing unit 120 and a clock signal having a suitable frequency for transmission for near field communications (e.g., 13.56 MHZ).

Figure 4:
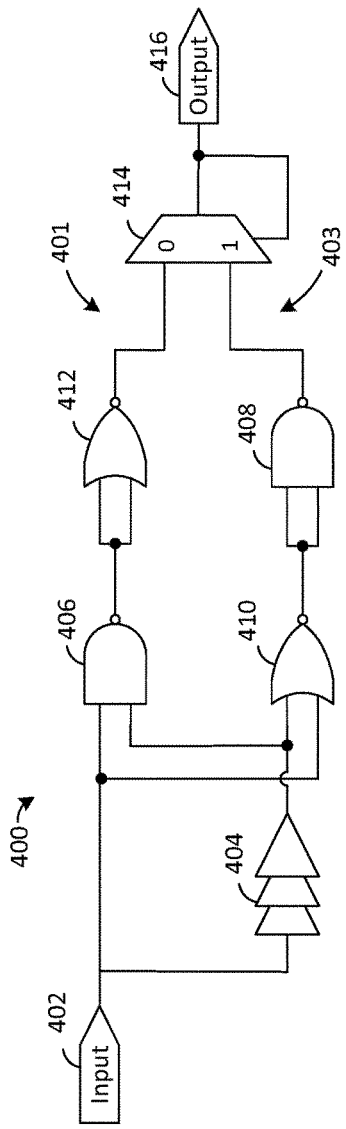
FIG. 4 depicts an example schematic diagram of certain components of a clock source in accordance with some embodiments of the present disclosure.

FIG. 4 depicts an example schematic diagram of certain components of the clock 124 in accordance with some embodiments of the present disclosure. In an embodiment, the components and circuitry depicted in FIG. 4 may correspond to a transition filter 400 to remove unwanted transitions (e.g., glitches) from the rising and falling edges of the clock signal. In other embodiments, the transition filter 400 can be used to remove unwanted transitions from the rising and falling edges of other data signals. Although particular components are depicted in the particular arrangement of FIG. 4, it will be understood that the transition filter 400 may include additional components, one or more of the components depicted in FIG. 4 may not be included in the transition filter 400, and the components of the transition filter 400 may be rearranged in any suitable manner. In one embodiment, the transition filter 400 includes at least an input connection 402, a delay element 404, first and second NAND gates 406 and 408, first and second NOR gates 410 and 412, a multiplexer 414, and an output connection 416.

The transition filter 400 can receive a clock signal at input connection 402. In one embodiment, the clock signal at input connection can be provided by either the clock source or the clock management unit. The input clock signal can be provided to a first path 401 and a second path 403 that is parallel to the first path 401. The first path 401 can include the first NAND gate 406 and the second NOR gate 412. The second path 403 can include the delay element 404, the first NOR gate 410 and the second NAND gate 408. The first path 401 and the second path 403 can be provided as individual inputs to multiplexer 414. The output of the multiplexer 414 can be coupled to output connection 416. The output connection 416 can be used to provide the output clock signal to another component of the clock 124 (e.g., clock management unit) or the reader chip 100 (e.g., contact interface 104).

The clock signal from input connection 402 can be provided to a first input of both the first NAND gate 406 and the first NOR gate 410, and to the delay element 404. The delay element 404 can delay the input clock signal by a predetermined time delay $\Delta T$ (see FIG. 5). In an embodiment, the predetermined time delay can be less than the period of the clock signal and longer than the period of any expected "glitches." In another embodiment, the predetermined time delay can be less than one-half (½) the period of the clock signal. In one embodiment, the delay element 404 can include one or more buffer elements or inverters to delay the input clock signal. However, in other embodiments, other elements (e.g., an RC filter) can be used to delay the input clock signal. The delayed clock signal from the delay element 404 can then be provided to the second input of both the first NAND gate 406 and the first NOR gate 410.

When the voltages of the signals at the first and second inputs of the first NAND gate 406 are both above a voltage threshold (e.g., a logical 1) for the NAND gate 406, the output of the first NAND gate 406 can be a signal having a voltage below the voltage threshold (e.g., a logical 0). In other words, when both the input clock signal and the delayed clock signal provided to the first NAND gate 406 are "high" voltage (e.g., logical 1s), the output signal of the first NAND gate 406 is "low" voltage (e.g., a logical 0). For any other combination of "high" or "low" inputs at the first NAND gate 406 provided by the input clock signal and the delayed clock signal, the output signal of the first NAND gate 406 can be "high" or a logical 1.

When the voltages of the signals at the first and second inputs of the first NOR gate 410 are both below the voltage threshold (e.g., a logical 0) for the NOR gate 410, the output of the first NOR gate 410 can be a signal having a voltage above the voltage threshold (e.g., a logical 1). In other words, when both the input clock signal and the delayed clock signal provided to the first NOR gate 410 are "low," (e.g., logical 0s), the output signal of the first NOR gate 410 is "high" (e.g., a logical 1). For any other combination of "high" or "low" inputs at the first NOR gate 410 provided by the input clock signal and the delayed clock signal, the output signal of the first NOR gate 410 can be "low" or a logical 0.

The output signal of the first NAND gate 406 can be provided to both inputs of the second NOR gate 412. The output signal of the second NOR gate 412 can be "high" or a logical 1 when the output signal of the first NAND gate 406 is "low" or a logical 0 and the output signal of the second NOR gate 412 can be "low" or a logical 0 when the output signal of the first NAND gate 406 is "high" or a logical 1. In one embodiment, since the inputs of the second NOR gate 412 are coupled together and receiving the same signal (e.g., the output of the first NAND gate 406), the second NOR gate 412 can operate similar to an inverter.

The output signal of the first NOR gate 410 can be provided to both inputs of the second NAND gate 408. The output signal of the second NAND gate 408 can be "high" or a logical 1 when the output signal of the first NOR gate 410 is "low" or a logical 0 and the output signal of the second NAND gate 408 can be "low" or a logical 0 when the output signal of the first NOR gate 410 is "high" or a logical 1. In one embodiment, since the inputs of the second NAND gate 408 are coupled together and receiving the same signal (e.g., the output of the first NOR gate 410), the second NAND gate 408 can operate similar to an inverter.

In one embodiment, the second NOR gate 412 and the second NAND gate 408 can be "replicas" (i.e., substantially the same or identical component) of the first NOR gate 410 and the first NAND gate 406. By using "replicas" of the first NOR gate 410 and the first NAND gate 406 for the second NOR gate 412 and the second NAND gate 408, the propagation delay between the input of the first NAND gate 406 and the output of the second NOR gate 412 can be the same as the propagation delay between the input of the first NOR gate 410 and the output of the second NAND gate 408. In other words, the first NAND gate 406 and second NOR gate 412 can be operating at the same speed as the first NOR gate 410 and the second NAND gate 408. By maintaining the same speed or propagation delay for the signals travelling through the first NAND gate 406 and second NOR gate 412 and the first NOR gate 410 and the second NAND gate 408, the duty cycle of the output signal can be maintained to be substantially the same as the duty cycle of the input signal at input connection 402. In one embodiment, if the input signal at input connection 402 is a clock signal having a duty cycle of 50%, then the output signal will maintain a duty cycle of 50%. In another embodiment, the first NAND gate 406 and second NOR gate 412 of the first path 401 can provide the same logical output as an AND gate (based on the same inputs) and the first NOR gate 410 and the second NAND gate 408 of the second path 403 can provide the same logical output as an OR gate (based on the same inputs).

The output signal of the second NOR gate 412 can be provided to a first input (identified with a 0 in FIG. 4) of the multiplexer 414 and the output signal of the second NAND gate 408 can be provided to a second input (identified with a 1 in FIG. 4) of the multiplexer 414. A selection signal provided to the multiplexer 414 determines whether the signal at the first input of the multiplexer 414 or the signal at the second input of the multiplexer 414 is provided to the output of the multiplexer 414. When the selection signal is "low" or a logical 0 (e.g., as a result of the output previously being a logical 0 or "low" signal), the multiplexer 414 provides the signal at the first input to the output connection 416. When the selection signal is "high" or a logical 1 (e.g., as a result of the output previously being a logical 1 or "high" signal), the multiplexer 414 provides the signal at the second input to the output connection 416. In one embodiment, the output of the multiplexer 414 can be used as the selection signal, thereby enabling the multiplexer 414 to be self-selecting.

Figure 5:
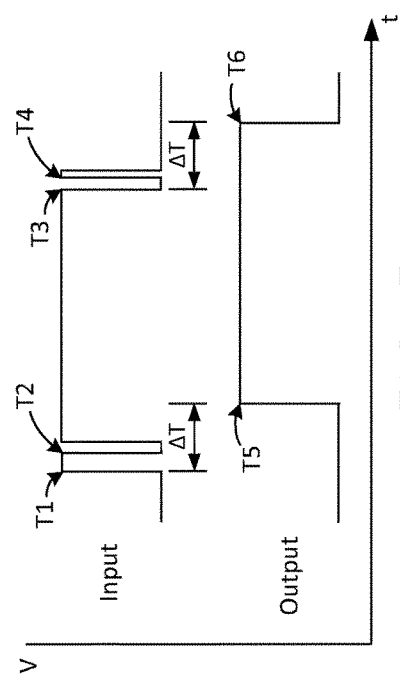
FIG. 5 depicts an illustrative timing diagram for the transition filter of FIG. 4 in accordance with some embodiments of the present disclosure.

An exemplary operation of the transition filter 400 will be described with respect to the input and output signals shown in FIG. 5. As shown in FIG. 5, unwanted transitions occurring in the input signal that are associated with the rising or falling edge of the signal are not propagated to the output signal. Thus, the transition filter 400 is able to provide "time domain hysteresis" to the input signal and remove any short-term changes in the input signal. In FIG. 5, the input signal transitions from "low" to "high" at time T1, an unwanted transition (or glitch) in the input signal occurs for a short duration at time T2, the input signal transitions from "high" to "low" at time T3, and another unwanted transition (or glitch) in the input signal occurs for a short duration at time T4. After the input signal of FIG. 5 passes through the transition filter 400, the output signal of FIG. 5 is produced. The output signal transitions from "low" to "high" at time T5 and transitions from "high" to "low" at time T6. The transitions in the output signal at T5 and T6 occur after a predetermined time delay ΔT from the corresponding transitions occurring at T1 and T3 in the input signal. As can be seen in the output signal of FIG. 5, the unwanted transitions in the input signal occurring at T2 and T4 are removed from the output signal by the transition filter 400 and the duty cycle is maintained due to the balanced delay ΔT that occurs at both transitions. In this manner, the transition filter 400 can remove unwanted transitions in the input signal that have a duration that is less than the predetermined time delay ΔT as described below.

As previously discussed, the output of the multiplexer 414 is selected from the signal at the first input (i.e., the output of the second NOR gate 412) or the signal at the second input (i.e., the output of the second NAND gate 408) based on the current output signal at output connection 416. In the exemplary embodiment of FIG. 5, the input signal and the output signal both start "low," such that the multiplexer 414 selects the first path 401 to provide the output signal. For as long as the input signal remains "low," the output signal remains "low" because the first input to the multiplexer is "low" due to the "low" inputs (i.e., the input signal and the delayed input signal) to the first NAND gate 406. The "low" output signal from the multiplexer 414 dictates the selection of the first input of the multiplexer 414 for the output, thus the second input to the multiplexer 414 does not need to be discussed at this time.

When the input signal transitions "high" at time T1, the output signal remains "low" until the predetermined time delay ΔT has lapsed at time T5, since the second input to NAND gate 406 remains low based on the delay ΔT of delay element 404. Once the predetermined time delay ΔT has lapsed, the output signal goes "high" since the first input to the multiplexer 414 is "high" due to the "high" inputs (i.e., the input signal and the delayed input signal) to the first NAND gate 406. The unwanted transition at time T2 is not propagated to the output signal since the output of the first NAND gate 406 remains "high" due to the delayed input signal being "low" for the predetermined time delay ΔT, which includes the period for the unwanted transition at T2. In other words, the first NAND gate 406 does not "see" the unwanted transition at T2 because the "low" or logical 0 input from the delayed input signal controls the output of the first NAND gate 406.

After the output signal at output connection 416 transitions to "high" at time T5 based on the delay ΔT, the multiplexer 414 begins using the signal at the second input of the multiplexer 414 for the output signal. The "high" output signal from the multiplexer 414 dictates the selection of the second input of the multiplexer 414 from the second path 403 for the output. Thus, the delayed version of the glitch at time T2 will not be seen in the first path 401 since the first path 401 is no longer selected. When both the input signal and the delayed input signal are both "high" and the second path 403 is selected, the second input to the multiplexer 414 is initially "high" due to the "high" inputs (i.e., the input signal and the delayed input signal) to the first NOR gate 410. When the delayed version of the glitch occurs in the delayed input signal, the unwanted transition is not propagated to the output signal since the output of the first NOR gate 410 remains "low" due to the input signal from input connection 402 remaining "high." In other words, the first NOR gate 410 does not "see" the unwanted transition in the delayed input signal because the "high" or logical 1 input of the input signal from the input connection 402 prevents the output of the first NOR gate 410 from transitioning (i.e., the "high" input signal controls the output of the first NOR gate 410).

When the input signal transitions "low" at time T3, the output signal remains "high" until the predetermined time delay ΔT has lapsed at time T6. Once the predetermined time delay ΔT has lapsed, the output signal goes "low" since the second input to the multiplexer 414 is "low" due to the "low" inputs (i.e., the input signal and the delayed input signal) to the first NOR gate 410. The unwanted transition at time T4 is not propagated to the output signal since the output of the first NOR gate 410 remains "high" due to the delayed input signal being "high" for the predetermined time delay, which includes the period for the unwanted transition at T4. In other words, the first NOR gate 410 does not "see" the unwanted transition at T4 because the "high" or logical 1 input from the delayed input signal controls the output of the first NOR gate 410.

After the output signal at output connection 416 transitions to "low" at time T6, the multiplexer 414 begins using the signal at the first input of the multiplexer 414 from the first path 401 for the output signal as previously discussed. Thus, the delayed version of the glitch at time T4 will not be seen in the second path 403 since the second path 403 is no longer selected. When both the input signal and the delayed input signal are both "low" and the first path 401 is selected, the first input to the multiplexer 414 is initially "low" due to the "low" inputs (i.e., the input signal and the delayed input signal) to the first NAND gate 406. When the delayed version of the glitch occurs in the delayed input signal, the unwanted transition is not propagated to the output signal since the output of the first NAND gate 406 remains "high" due to the input signal from input connection 402 remaining "low." In other words, the first NAND gate 406 does not "see" the unwanted transition in the delayed input signal because the "low" or logical 0 input of the input signal from the input connection 402 prevents the output of the first NAND gate 406 from transitioning (i.e., the "low" input signal controls the output of the first NOR gate 410).

Figure 6:
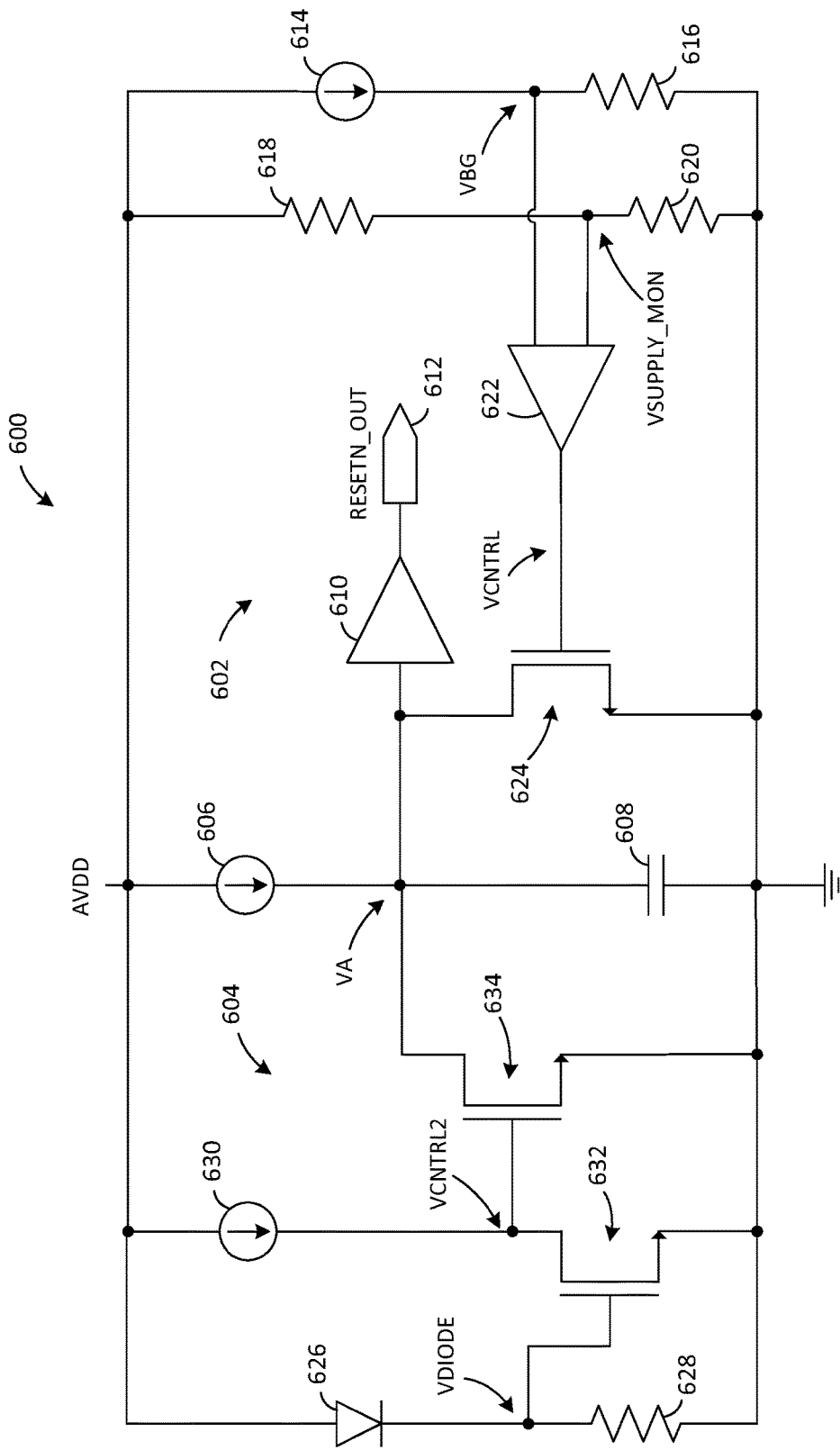
FIG. 6 depicts an example schematic diagram of certain components of a bias generator in accordance with some embodiments of the present disclosure.

FIG. 6 depicts an example schematic diagram of certain components of a bias generator 126 in accordance with some embodiments of the present disclosure. In one embodiment, the components and circuitry depicted in FIG. 6 may correspond to a supply voltage monitoring circuit 600 to monitor the supply voltage (AVDD) provided by the bias generator 126 and provide a reset signal (RESETN_OUT) when the supply voltage is low (i.e., below a predetermined threshold voltage). Although particular components are depicted in the particular arrangement of FIG. 6, it will be understood that the supply voltage monitoring circuit 600 may include additional components, one or more of the components depicted in FIG. 6 may not be included in the supply voltage monitoring circuit 600, and the components of the supply voltage monitoring circuit 600 may be rearranged in any suitable manner.

In one embodiment, the supply voltage monitoring circuit 600 includes at least a first voltage monitoring circuit 602, a second voltage monitoring circuit 604, a first current source 606, a capacitor 608, a first comparator 610 and an output connection 612. The first voltage monitoring circuit 602 can include at least a bandgap circuit with a second current source 614 and a first resistor 616, a voltage divider with a second resistor 618 and a third resistor 620, a second comparator 622 and a first switching element 624. The second voltage monitoring circuit 604 can include a diode 626, a fourth resistor 628, a third current source 630, a second switching element 632 and third switching element 634.

The supply voltage monitoring circuit 600 can be used to provide a RESETN_OUT signal. The RESETN_OUT signal provided at output connection 612 can be used to control operation of one or more elements of the reader chip 100 based on the level of the supply voltage AVDD provided by the bias generator 126. In one embodiment, AVDD can be 3.3 V, but AVDD can have different voltage values in other embodiments. If AVDD drops below a predetermined supply voltage threshold, the RESETN_OUT signal can be used to initiate a reset state in one or more of the elements of the reader chip 100. In an embodiment, the predetermined supply voltage threshold can be set by the voltage divider as discussed in detail below and can be a voltage in the range of about 2.3 V to about 3.2 V. In one embodiment, the RESETN_OUT signal can be "high" or a logical 1 when AVDD is greater than the predetermined supply voltage threshold and can be "low" or a logical 0 when AVDD is less than the predetermined supply voltage threshold. When the RESETN_OUT signal is "low," one or more elements of the reader chip 100 can be placed in a reset state until AVDD stabilizes to a voltage greater than the predetermined supply voltage threshold and the RESETN_OUT signal becomes "high." However, in other embodiments, the one or more elements of the reader chip 100 can be placed in a reset state in response to the RESETN_OUT signal becoming "high" or a logical 1.

The RESETN_OUT signal is provided to output connection 612 by the first comparator 610. The output of the first comparator 610 can be controlled by the voltage at VA, which is provided as an input to the first comparator. The first comparator 610 compares the voltage at VA with a predetermined reset voltage threshold (or a predetermined comparator voltage threshold). When the voltage at VA is less than the predetermined reset voltage threshold, the first comparator 610 can output a reset voltage value that is "low" or logical 0 as the RESETN_OUT signal (corresponding to AVDD being less than the predetermined supply voltage threshold) and when the voltage at VA is greater than or equal to the predetermined reset voltage threshold, the first comparator 610 can output an operational voltage value that is "high" or logical 1 as the RESETN_OUT signal (corresponding to AVDD being greater than the predetermined supply voltage threshold). In one embodiment, the first comparator 610 can be a Schmitt trigger, however other configurations of the first comparator 610 are possible in other embodiments.

The voltage at VA can be controlled through the operation of the first current source 606, capacitor (or charge storing device) 608, first switching element 624 and third switching element 634. The first current source 606 is coupled between AVDD and VA and can be used to charge capacitor 608, which is coupled between VA and ground. When both the first switching element 624 of the first voltage monitoring circuit 602 and the third switching element 634 of the second monitoring circuit are in an "off" state (i.e., operating as an open circuit) in response to receiving an enabling voltage, the charge capacitor 608 may be charged by the first current source 606. As the capacitor 608 is charging, the voltage at VA increases from the stored charge in the capacitor 608, which provides an enabling input to the first comparator 610.

Once the voltage at VA is equal to or greater than the predetermined reset voltage threshold, the RESETN_OUT signal that is output from the first comparator 610 can change from "low" or a logical 0 to "high" or a logical 1 as discussed above.

Each of the first switching element 624 and the third switching element 634 can also be coupled between VA and ground when in an "on" state in response to receiving a disabling voltage. If either or both of the first switching element 624 and the third switching element 634 is in an "on" state (i.e., operating as a short circuit), then the first current source 606 does not charge the capacitor 608 because the "on" switching element sinks the current from the first current source 606 to ground and discharges the capacitor 608. When the capacitor 608 is discharged, the voltage at VA drops and eventually falls to about 0 V (volts), which provides a disabling input to the first comparator 610. Once the voltage at VA falls below the predetermined reset voltage threshold (e.g., including, in some embodiments, an additional hysteresis drop), the RESETN_OUT signal that is output from the first comparator 610 can become "low" or a logical 0. In an embodiment, the first current source 606 can include one or more transistors and one or more resistors. However, other configurations of the first current source 606 are possible in other embodiments. In another embodiment, the first switching element 624 and the third switching element 634 can each be a p-channel MOSFET (metal oxide semiconductor field effect transistor). However, the first switching element 624 and the third switching element 634 can use other types of transistors (e.g., a bipolar junction transistor (BJT) or a junction field effect transistor (JFET)) or other switching configurations using other components (e.g., a physical switch or other semiconductor devices) in other embodiments.

The first voltage monitoring circuit 602 can be used to switch the first switching element 624 to the "on" state when AVDD is less than the predetermined supply voltage threshold. When AVDD is greater than the predetermined supply voltage threshold, the first voltage monitoring circuit 602 can switch the first switching element 624 to the "off" state. The first switching element 624 can be controlled by the voltage at VCNTRL, which corresponds to the output of the second comparator 622. When the voltage at VCNTRL is "high" or a logical 1, the first switching element 624 is switched to the "on" state and when the voltage at VCNTRL is "low" or a logical 0, the first switching element 624 is switched to the "off" state. As discussed above, the first switching element 624 can be a p-channel MOSFET in one embodiment. The gate of the switching element 624 can be coupled to VCNTRL, the source can be coupled to ground and the drain can be coupled to VA.

The output of the second comparator 622 can be based on a comparison between a first input receiving the voltage at VBG, which is an output voltage from the bandgap circuit, and a second input receiving the voltage at VSUPPLY_MON, which is an output voltage from the voltage divider. When the voltage at VBG is greater than the voltage at VSUPPLY_MON, the second comparator 622 can output a "high" or logical 1 signal and when the voltage at VBG is less than or equal to the voltage at VSUPPLY_MON, the second comparator can output a "low" or logical 0 signal. In one embodiment, the second comparator 622 can be an operational amplifier, but other configurations of the second comparator 622 are possible in other embodiments.

As discussed above, the voltage divider can include the second resistor 618 and the third resistor 620 and can be used to establish a proportional supply voltage or monitor voltage at VSUPPLY_MON. The second resistor 618 can be coupled between AVDD and VSUPPLY_MON and the third resistor 620 can be coupled between VSUPPLY_MON and ground. The voltage at VSUPPLY_MON can be used by the second comparator 622 to monitor AVDD and corresponds to a predetermined portion of AVDD based on the resistance values of the second resistor 618 and the third resistor 620. In one embodiment, the ratio of the resistance values between the second resistor 618 and the third resistor 620 can be selectable to obtain different predetermined supply voltage thresholds. In other words, the resistance values for the second resistor 618 and the third resistor 620 can be selected such that different values for AVDD can result in the voltage at VSUPPLY_MON dropping below the voltage at VBG. For example, the second resistor 618 and the third resistor 620 may have resistance values such that the voltage at VSUPPLY_MON drops below the voltage at VBG when AVDD is 3 V. Thus, the predetermined supply voltage threshold would be established at 3V as a result of the configuration of the second resistor 618 and the third resistor 620. However, the second resistor 618 and the third resistor 620 may have resistance values such that the voltage at VSUPPLY_MON drops below the voltage at VBG when AVDD is 2.4 V, which would result in the predetermined supply voltage threshold being 2.4 V.

The bandgap circuit can be used to establish a substantially constant and temperature independent voltage at VBG. The bandgap circuit can be coupled to AVDD and can begin operating once AVDD exceeds a predetermined bandgap voltage threshold (or bandgap turn-on voltage). In one embodiment, the predetermined bandgap voltage threshold can be about 0.74 V, but other voltages can be used as the predetermined bandgap voltage in other embodiments. The bandgap circuit includes the second current source 614 coupled between AVDD and VBG and the first resistor 616 coupled between VBG and ground. The first resistor 616 can be a polysilicon resistor in one embodiment, but can be other types of resistors in other embodiments. The second current source 614 can provide a current that is inversely proportional to the sheet resistance of the first resistor 616. The current from the second current source 614 when driven into the first resistor 616 can produce a fixed or constant voltage over process and temperature. In one embodiment, the current from the second current source 614 can be provided from an analog front end (AFE) circuit on the reader chip 100. In another embodiment, the second current source 614 and the first resistor 616 can be manufactured on the same material in order to have the same temperature coefficient. In an embodiment, the second current source 614 can include one or more transistors and one or more resistors. However, other configurations of the second current source 614 are possible in other embodiments.

The second voltage monitoring circuit 604 can be used to monitor AVDD when AVDD is less than a predetermined bandgap voltage threshold at which the first voltage monitoring circuit 602 is inoperable or unpredictable due to variances in the operation of the bandgap circuit due to the low AVDD. The second voltage monitoring circuit 604 can be used to switch the third switching element 634 to the "on" state (e.g., such that capacitor 608 will be discharged and will not charge) when AVDD is less than a predetermined diode voltage threshold for diode 626. When AVDD is greater than the predetermined diode voltage threshold, the second voltage monitoring circuit 604 can switch the third switching element 634 to the "off" state to allow capacitor 608 to be charged. The third switching element 634 can be controlled by the voltage at VCNTRL2. When the voltage at VCNTRL2 is "high" or a logical 1, the third switching element 634 is switched to the "on" state and when the voltage at VCNTRL2 is "low" or a logical 0, the third switching element 634 is switched to the "off" state. As discussed above, the third switching element 624 can be a p-channel MOSFET in one embodiment. The gate of the switching element 624 can be coupled to VCNTRL2, the source can be coupled to ground and the drain can be coupled to VA.

The second voltage monitoring circuit 604 can include the third current source 630, which is coupled to AVDD and VCNTRL2. The third current source 630 can be used to set the voltage at VCNTRL2 to "high" or a logical 1 when the second switching element 632 is in an "off" state. In one embodiment, the second switching element 632 can operate like an open-drain transistor. When the second switching element 632 is in the "on" state, the second switching element 632 sinks the current from the third current source 630 to ground and the voltage at VCNTRL2 goes to about 0 V, which corresponds to a "low" or logical 0 signal at VCNTRL2. In an embodiment, the third current source 630 can include one or more transistors and one or more resistors. However, other configurations of the third current source 630 are possible in other embodiments.

The second switching element 632 is switched to the "on" state when the voltage at VDIODE is "high" or a logical 1 and the second switching element 632 is switched to the "off" state when the voltage at VDIODE is "low" or a logical 0. In one embodiment, the second switching element 632 can be a p-channel MOSFET. However, the second switching element 632 can use other types of transistors (e.g., a bipolar junction transistor (BJT) or a junction field effect transistor (JFET)) or other switching configurations using other components (e.g., a physical switch or other semiconductor devices) in other embodiments. The gate of the second switching element 632 can be coupled to VDIODE, the source can be coupled to ground and the drain can be coupled to VCNTRL2. The voltage at VDIODE is based on whether AVDD is greater than or less than a predetermined diode voltage threshold associated with diode 626. When AVDD is greater than the predetermined diode voltage threshold, current flows through the diode 626 and the fourth resistor 628 provides a voltage at VDIODE. When VDIODE is greater than the threshold voltage for the second switching element 632 (i.e., VDIODE becomes a logical 1), the second switching element 632 is switched to the "on" state. In contrast, when AVDD is less than the predetermined diode voltage threshold, the diode 626 blocks current and the fourth resistor 628 pulls the voltage at VDIODE to about 0 V and the second switching element 632 is switched to the "off" state.

An exemplary operation of the voltage monitoring circuit 600 will be described with respect to the input and output signals shown in FIGS. 7 and 8. FIG. 7 shows the values of selected signals during a power-on event (i.e., AVDD goes from 0 V to the desired voltage level). FIG. 8 shows the values of selected signals during a brown-out event (i.e., AVDD drops below the predetermined supply voltage threshold for a short time period).

As shown in FIG. 7, AVDD starts at about 0 V at time t0 and gradually increases until AVDD reaches its maximum values at time t6. Since VSUPPLY_MON is based on AVDD, the VSUPPLY_MON signal tracks AVDD, except that it is at a fraction of the value of AVDD. At time t0, the voltage at VDIODE will be 0V (which switches "off" the second switching element 632) since AVDD is not greater than the predetermined diode voltage threshold and the voltage at VCNTRL2 will be "high" or a logical 1 (which turns on the third switching element 634) since the second switching element 632 is "off." Because of the third switching element 634 being "on" at time t0, the voltage at VA is about 0 V since the third switching element 634 shorts VA to ground and results in the RESETN_OUT signal being "low." The voltage at VBG is about 0 V at time t0 since AVDD is not greater than predetermined bandgap voltage threshold to operate the bandgap circuit. With VBG at a low voltage, VCNTRL can be "low" since VSUPPLY_MON is greater than or equal to VBG and the first switching element 624 can be switched "off."

At time t1, the bandgap circuit switches "on" since AVDD is greater than the predetermined bandgap voltage threshold. The bandgap circuit then begins providing the bandgap reference voltage at VBG at time t2. Since the bandgap reference voltage at t2 is greater than the voltage at VSUPPLY_MON, the signal at VCNTRL goes "high" and switches "on" the first switching element 624. Because of the first switching element 624 being on at time t2, the voltage at VA is about 0 V since the first switching element 624 shorts VA to ground and results in the RESETN_OUT signal being "low." VCNTRL can remain "high" until time t5, when it switches to "low" in response to the voltage at VSUPPLY_MON being greater than the bandgap reference voltage at VBG. At time t3, the diode 626 switches "on" since AVDD is greater than the predetermined diode voltage threshold. The diode 626 then begins permitting some current flow and the voltage at VDIODE begins to increase. At time t4, the voltage at VDIODE becomes greater than the threshold voltage for the second switching element 632 and the second switching element 632 switches "on." The switching of the second switching element "on" sinks the current from third current source 630 to ground and drives the voltage at VCNTRL2 to about 0 V, which turns "off" the third switching element 634.

When VCNTRL switches "low" at time t5, the first switching element 624 switches "off" and the first current source 606 can begin to charge capacitor 608 (since the third switching element switched "off" at time t4). The voltage at VA can increase from the charging of the capacitor 608 and at time t6, the voltage VA becomes greater than the predetermined reset voltage threshold and the RESETN_OUT signal from the first comparator 610 switches to "high" or a logical 1.

As shown in FIG. 8, AVDD starts at its maximum voltage at time t0, begins a brown-out event at time t1, reaches a reduced voltage value at time t2, ends the brown-out event at time t3 and returns to its maximum voltage at times t4 and t5. Since VSUPPLY_MON is based on AVDD, the VSUPPLY_MON signal tracks AVDD, except that it is at a fraction of the value of AVDD. Since AVDD is greater than the predetermined diode voltage threshold for the diode 626, the diode 626 is "on" and the voltage at VDIODE is "high". Because the voltage at VDIODE is "high," the second switching element 632 switches "on." The switching "on" of the second switching element sinks the current from third current source 630 to ground and drives the voltage at VCNTRL2 to about 0 V, which turns "off" the third switching element 634.

At time t0, the voltage at VSUPPLY_MON is greater than the bandgap reference voltage at VBG, which results in VCNTRL being "low" and the first switching element 624 is switched "off." With both the first switching element 624 and the third switching element 634 switched "off," the first current source 606 can charge capacitor 608 and drive the voltage at VA to be greater than the predetermined reset voltage threshold, which results in the RESETN_OUT signal from the first comparator 610 being "high" or a logical 1.

When the brown-out event occurs at time t1, the bandgap reference voltage becomes greater than the voltage at VSUPPLY_MON and the signal at VCNTRL goes "high" and switches "on" the first switching element 624. Because of the first switching element 624 being on at time t1, the voltage at VA is about 0 V since the first switching element 624 shorts VA to ground and results in the RESETN_OUT signal being "low." Once the brown-out event ends at time t4, the voltage at VSUPPLY_MON becomes greater than the bandgap reference voltage at VBG and the signal at VCNTRL switches "low." When VCNTRL switches "low" at time t4, the first switching element 624 switches "off" and the first current source 606 can begin to charge capacitor 608 (since the third switching element was switched "off" at time t0). The voltage at VA can increase from the charging of the capacitor 608 and, at time t5, the voltage VA becomes greater than the predetermined reset voltage threshold and the RESETN_OUT signal from the first comparator 610 switches to "high" or a logical 1.

Figure 9:
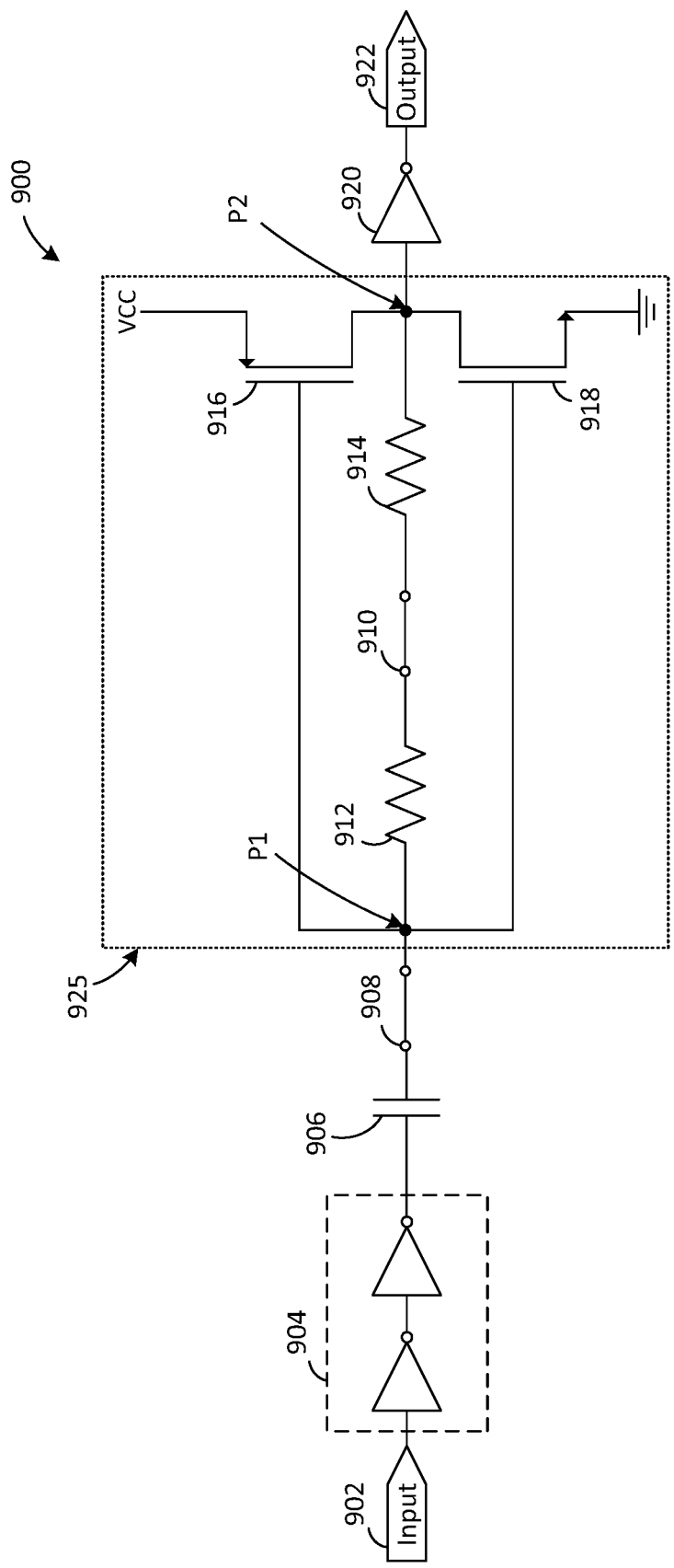
FIG. 9 depicts an example schematic diagram of certain components of a AC level shifting circuit in accordance with some embodiments of the present disclosure.

FIG. 9 depicts an example schematic diagram of certain components of AC level shifting circuit in accordance with some embodiments of the present disclosure. In one embodiment, the components and circuitry depicted in FIG. 9 may correspond to a level shifting circuit 900 to shift the voltage level of an incoming clock signal from a first level to a second level greater than the first level. Although particular components are depicted in the particular arrangement of FIG. 9, it will be understood that the level shifting circuit 900 may include additional components, one or more of the components depicted in FIG. 9 may not be included in the level shifting circuit 900, and the components of the level shifting circuit 900 may be rearranged in any suitable manner. In one embodiment, the level shifting circuit 900 includes at least an input connection 902, a buffer 904, a capacitor 906, a first switch 908 and a second switch 910, a self-biased inverter 925, an inverter 920 and an output connection 922. The self-biased inverter 925 can include a first resistor 912 and a second resistor 914, a first switching element 916 and a second switching element 918.

The level shifting circuit 900 can be used to raise (or boost) the voltage level of the signal provided at the input connection 902 to a desired voltage level for the signal at the output connection 922. In one embodiment, the level shifting circuit 900 can adjust an about 1.2 V periodic input signal to an about 5 V periodic output signal having the same frequency as the input signal. However, the level shifting circuit 900 can be used with different input voltages and can provide different output voltages in other embodiments. In addition, the level shifting circuit 900 can provide the output signal with substantially the same duty cycle of the input signal.

The level shifting circuit 900 can receive an input signal at input connection 902. In one embodiment, the input signal can be a 1.2 V clock signal. The input signal is passed through a buffer element 904 and a capacitor 906, which AC couples the input signal to the self-biased inverter 925 at P1. In an embodiment, the buffer element 904 can include one or more inverters, but other components can be used for the buffer element 904 in other embodiments. In an embodiment, the capacitor 906 can have a capacitance of about 1.25 pF (picoFarads), but can have other capacitances in other embodiments. In another embodiment, the capacitor 906 can operate similar to a high pass filter to remove frequencies below a predetermined threshold frequency. The capacitor 906 can be configured to pass the frequency of the input signal but to remove any DC component of the input signal.

The self-biased inverter 925 can have an input P1 that is biased at a bias voltage. In one embodiment, the bias voltage can correspond to the threshold voltage for the self-biased inverter 925. The input signal from the capacitor 906 can then be AC coupled to (i.e., ride on) the bias voltage at P1 and either switch the self-biased inverter 925 to an "on" state when the input signal is "high" or a logical 1 or switch the self-biased inverter 925 to an "off" state when the input signal is "low" or a logical 0. In other words, the input signal from the capacitor 906, when positive or "high," can increase the input voltage at P1 such that the input voltage for the self-biased inverter 925 exceeds the threshold voltage (and the self-biased inverter 925 can switch to the "on" state) and the input signal from the capacitor 906, when negative or "low," can decrease the input voltage at P1 such that the input voltage for the self-biased inverter 925 does not exceed the threshold voltage (and the self-biased inverter 925 can switch to the "off" state). The self-biased inverter 925 can output a "low" or logical 0 when in the "on" state and a "high" or logical 1 when in the "off" state. The output of the self-biased inverter 925 at P2 can be provided to inverter 920 to convert the output of the self-biased inverter 925 to a signal for output connection 922 that matches the polarity of the input clock signal (e.g., when the input clock signal is "high," the output signal can be "high"). The output of the self-biased inverter 925, when "high" can be at a voltage corresponding to the voltage at VCC, which voltage level is carried through to the output signal of the inverter 920 (i.e., the output of the inverter 920 when "high" can be at a voltage corresponding to the voltage at VCC).

The self-biased inverter 925 can include a first switching element 916 connected in series with a second switching element 918. The first switching element 916 and the second switching element 918 both receive the same input from P1. Similarly, the output of the first switching element 916 and the second switching element 918 are coupled together at P2. In addition, the output at P2 is connected in a feedback loop to the input at P1. The feedback loop can include a first resistor 912 and a second resistor 914 in one embodiment. However, the feedback loop can use different configurations in other embodiments such as more or less resistors than is shown in FIG. 9 or additional components (e.g., capacitors). In an embodiment, the first resistor 912 and the second resistor 914 can have each have a resistance of about 500 kΩ (kilohms), but can have other resistances or different resistances in other embodiments. In addition, the first switching element 916 can be connected to the voltage source VCC and the second switching element can be connected to ground. In an embodiment, VCC can be 5 V, but VCC can have other voltages in other embodiments. In an embodiment, the first switching element 916 can be an n-channel MOSFET and the second switching element 918 can be a p-channel MOSFET. However, the first switching element 916 and the second switching element 918 can use other types of transistors (e.g., a bipolar junction transistor (BJT) or a junction field effect transistor (JFET)) or other switching configurations using other components (e.g., a physical switch or other semiconductor devices) in other embodiments.

In one embodiment, when a "high" input is provided at P1, the first switching element 916 switches "off" to operate like an open circuit and the second switching element 918 switches "on" to operate like a short circuit, which pulls P2 to ground (i.e., 0 V). When a "low" input is provided at P1, the second switching element 918 switches "off" to operate like an open circuit and the first switching element 916 switches "on" to operate like a short circuit, which results in P2 seeing the voltage at VCC (e.g., 5 V). The operation of the first switching element 916 to provide the voltage at VCC to P2 on a "low" input can be used in conjunction with the feedback loop having the first resistor 912 and the second resistor 914 to establish the bias voltage at P1. In one embodiment, the bias voltage can be at one-half (½) of the voltage at VCC.

The level shifting circuit 900 can also include a first switch 908 and a second switch 910. The first switch 908 and the second switch 910 can be in a closed position during operation of the level shifting circuit. When the level shifting circuit 900 is to be deactivated (or powered down), one or both of the first switch 908 and the second switch 910 can be opened to decouple the capacitor 906 and the input P1 to the self-biased inverter 925 or to remove the feedback path from the self-biased inverter 925.

Since the self-biased inverter 925 has a bias voltage at the input P1 that is approximate to the threshold voltage, the self-biased inverter 925 can maintain the duty cycle of the input signal at the output P2 from the self-biased inverter 925. As discussed above, the changes in the input signal between "high" and "low" when combined with the bias voltage at P1 can result in similarly timed changes in the input to the self-biased inverter 925, thereby maintaining the duty cycle of the input signal in the output of the self-biased inverter 925 and at output connection 922.

The foregoing is merely illustrative of the principles of this disclosure and various modifications may be made by those skilled in the art without departing from the scope of this disclosure. The above described embodiments are presented for purposes of illustration and not of limitation. The present disclosure also can take many forms other than those explicitly described herein. Accordingly, it is emphasized that this disclosure is not limited to the explicitly disclosed methods, systems, and apparatuses, but is intended to include variations to and modifications thereof, which are within the spirit of the following claims.

As a further example, variations of apparatus or process parameters (e.g., dimensions, configurations, components, process step order, etc.) may be made to further optimize the provided structures, devices and methods, as shown and described herein. In any event, the structures and devices, as well as the associated methods, described herein have many applications. Therefore, the disclosed subject matter should not be limited to any single embodiment described herein, but rather should be construed in breadth and scope in accordance with the appended claims.

What is claimed is:

1. A system for removing unwanted transitions from a clock signal, the system comprising:
   an input connection to receive an input clock signal;
   an output connection to provide an output clock signal;
   a delay element coupled to the input connection to provide a delayed clock signal based on a time delay of the delay element and the input clock signal;
   a first path coupled to the input connection, the first path comprising:
      a first NAND gate coupled to the input connection to receive the input clock signal and to the delay element to receive the delayed clock signal; and
      a first NOR gate coupled to the first NAND gate, the first NOR gate configured to output a first path signal and having a first input and a second input coupled to an output of the first NAND gate;
   a second path coupled to the input connection, the second path comprising:
      a second NOR gate coupled to the input connection to receive the input clock signal and to the delay element to receive the delayed clock signal; and
      a second NAND gate coupled to the second NOR gate, the second NAND gate configured to output a second path signal and having a first input and a second input coupled to an output of the second NOR gate; and
   a multiplexer coupled to the first NOR gate to receive the first path signal, to the second NAND gate to receive the second path signal, to the output connection to provide one of the first path signal or the second path signal as the output clock signal, and to a selection input, wherein the selection input causes the first path signal to be provided as the output clock signal when the output clock signal is at a first voltage level and causes the second path signal to be provided as the output clock signal when the output clock signal is at a second voltage level, and wherein the second voltage level is a higher voltage than the first voltage level.

2. The system of claim 1, wherein the time delay is less than one-half of a period of the clock signal.

3. The system of claim 1, wherein the first NAND gate the first NOR gate have a propagation delay substantially equal to a propagation delay of the second NOR gate and the second NAND gate.

4. The system of claim 1, wherein the output clock signal has a duty cycle substantially equal to a duty cycle of the input clock signal.

5. The system of claim 1, wherein the delay element comprises at least one inverter.

6. A transition filter for a signal, the transition filter comprising:
   an input connection to receive an input signal;
   an output connection to provide an output signal;
   a delay element coupled to the input connection to receive the input signal, the delay element configured to delay the input signal by a time delay to generate a delayed input signal;
   a first logic circuit coupled to the input connection to receive the input signal as a first input and to the delay element to receive the delayed input signal as a second input, the first logic circuit configured to provide a first output;
   a second logic circuit coupled to the input connection to receive the input signal as a first input and to the delay element to receive the delayed input signal as a second input, the second logic circuit configured to provide a second output;
   a multiplexer coupled to the first logic circuit and the second logic circuit to receive, as inputs the first output from the first logic circuit and the second output from the second logic circuit, the multiplexer configured to select, based on a selection signal, one of the first output or the second output to provide as the output signal to the output connection;
   wherein the first logic circuit, the second logic circuit and the multiplexer are configured to remove transitions in the input signal having a duration less than the time delay from the output signal.

7. The transition filter of claim 6, wherein the time delay is less than a period of the input signal.

8. The transition filter of claim 6, wherein the first logic circuit has a propagation delay substantially equal to a propagation delay of the second logic circuit.

9. The transition filter of claim 6, wherein the output signal has a duty cycle substantially equal to a duty cycle of the input signal.

10. The transition filter of claim 6, wherein the delay element comprises at least one inverter.

11. The transition filter of claim 6, wherein the first output from the first logic circuit corresponds to an output from an AND gate and the second output from the second logic circuit corresponds to an output from an OR gate.

12. The transition filter of claim 6, wherein the selection signal for the multiplexer is the output signal.

13. The transition filter of claim 6, wherein the first logic circuit is configured to remove transitions in the input signal less than the time delay in response to the input signal transitioning from a first state to a second state and the second logic circuit is configured to remove transitions in the input signal less than the time delay in response to the input signal transitioning from the second state to the first state.

14. The transition filter of claim 6, wherein the first logic circuit includes a first NAND gate coupled in series with a first NOR gate, the first NOR gate configured to provide the first output, and the first NAND configured to receive the input signal and the delayed input signal as inputs.

15. The transition filter of claim 14, wherein the first NOR gate has a first input and a second input each receiving an output of the first NAND gate.

16. The transition filter of claim 14, wherein the second logic circuit includes a second NOR gate coupled in series with a second NAND gate, the second NAND gate configured to provide the second output, and the second NOR gate configured to receive the input signal and the delayed input signal as inputs.

17. The transition filter of claim 16, wherein the second NAND gate has a first input and a second input each receiving an output of the second NOR gate.

18. The transition filter of claim 16, wherein the second NAND gate is substantially identical to the first NAND gate and the first NOR gate is substantially identical to the second NOR gate.

19. A method for removing unwanted transition from a signal, the method comprising:
    delaying, with a delay element, an input signal by a time delay to generate a delayed input signal;
    processing the input signal and the delayed input signal with a first logic circuit, the first logic circuit configured to generate a first logic circuit output;
    processing the input signal and the delayed input signal with a second logic circuit, the second logic circuit configured to generate a second logic circuit output;
    selecting, with a multiplexer, one of the first logic circuit output or the second logic circuit output to be an output signal; and
    removing from the output signal transitions in the input signal having a duration less than the time delay with the first logic circuit, the second logic circuit and the multiplexer.

20. The method of claim 19, wherein the selecting one of the first logic circuit output or the second logic circuit output includes selecting the first logic circuit output in response to the output signal having a first value and selecting the second logic circuit output in response to the output signal having a second value different from the first value.

21. The method of claim 20, wherein the removing from the output signal includes transitioning, after expiration of the time delay, the first logic circuit output from the first value to the second value in response to the input signal changing from the first value to the second value.

22. The method of claim 21, wherein the first logic circuit includes a first NAND gate coupled in series with a first NOR gate, the first NOR gate configured to provide the first logic circuit output, and the first NAND configured to receive the input signal and the delayed input signal as inputs.

23. The method of claim 20, wherein the removing from the output signal includes transitioning, after expiration of the time delay, the second logic circuit output from the second value to the first value in response to the input signal changing from the second value to the first value.

24. The method of claim 23, wherein the second logic circuit includes a second NOR gate coupled in series with a second NAND gate, the second NAND gate configured to provide the second logic circuit output, and the second NOR gate configured to receive the input signal and the delayed input signal as inputs.

25. The method of claim 19, wherein the delaying the input signal includes passing the input signal through at least one inverter.

* * * * *